(12) United States Patent
Wang

(10) Patent No.: US 6,788,107 B2
(45) Date of Patent: Sep. 7, 2004

(54) VARIABLE VOLTAGE TOLERANT INPUT/OUTPUT CIRCUIT

(75) Inventor: Chih-hsien Wang, Hsin Chu (TW)

(73) Assignee: Brilliance Semiconductor, Inc. (TW)

( * ) Notice: Subject to any disclaimer, the term of this patent is extended or adjusted under 35 U.S.C. 154(b) by 130 days.

(21) Appl. No.: 10/313,572

(22) Filed: Dec. 6, 2002

(65) Prior Publication Data

US 2003/0107405 A1 Jun. 12, 2003

(30) Foreign Application Priority Data

Dec. 7, 2001 (TW) ...................................... 90130482 A

(51) Int. Cl.[7] .......................................... H03K 19/0948
(52) U.S. Cl. .............................. 326/81; 326/83; 326/33
(58) Field of Search .............................. 326/80, 81, 83, 326/86, 87, 33; 327/534

(56) References Cited

U.S. PATENT DOCUMENTS

| | | | | |
|---|---|---|---|---|
| 5,574,389 A | * | 11/1996 | Chu | 326/81 |
| 6,118,301 A | * | 9/2000 | Singh et al. | 326/58 |
| 6,144,221 A | * | 11/2000 | Oshima | 326/80 |
| 6,320,415 B1 | | 11/2001 | Lee | 326/81 |

* cited by examiner

*Primary Examiner*—Daniel Chang
(74) *Attorney, Agent, or Firm*—Martine & Penilla, LLP

(57) ABSTRACT

A variable voltage tolerant input/output circuit, wherein a leakage current is not produced while having a high reliability, characterized in that the circuit includes a clamping circuit for clamping the N-well potential of M1. When the supply voltage $V_{CC}$ is higher than or equal to the input/output voltage $V_{I/O}$, the N-well potential of M1 is clamped to the supply voltage $V_{CC}$; when the supply voltage $V_{CC}$ is lower than the input/output voltage $V_{I/O}$, the N-well potential of M1 is clamped to the input/output voltage $V_{I/O}$.

3 Claims, 4 Drawing Sheets

VARIABLE VOLTAGE TOLERANT INPUT/OUTPUT CIRCUIT

BACKGROUND OF THE INVENTION

1. Field of the Invention

The invention relates to a variable voltage tolerant input/output circuit, and more particularly, to a variable voltage tolerant input/output circuit that produces no leakage current.

2. Description of Related Art

Owing to the constant miniaturization of integrated circuits by advanced fabrication techniques, the supply voltage of a single chip has to be lowered continuously to maintain the stable and reliable operational characteristics of the integrated circuits. The power consumption is reduced in such manner and the circuit speed is also improved. Certain types of products, due to present fabrication techniques, need to operate within comparatively higher voltage ranges, thereby resulting in different integrated circuits on a same printed circuit board sharing the same data bus while using different supply voltages. When the difference between the data bus voltage produced by an integrated circuit with high supply voltage and an integrated circuit with low supply voltage gets too large, the data bus voltage is distorted and the power consumption of the integrated circuit gets too large as well, and therefore normal functioning and operation may not be brought into full play.

FIG. 1 shows a conventional single voltage input/output circuit, which includes PMOS transistors M1, M3 and M5, and NMOS transistor M2, M4 and M6. The gates of M3 and M4 are coupled to an input control signal PU, the gates of M5 and M6 are coupled to another input control signal PD, the drain of M2 is coupled to an output circuit, one P+ region of M1 is coupled via an electrode to the output circuit, while the other P+ region is coupled via an electrode to the supply voltage $V_{CC}$, the sources of M3 and M5 are coupled to the supply voltage $V_{CC}$, the sources of M2, M4 and M6 are coupled to the ground voltage $V_{SS}$, the drains of M3 and M4 are coupled to the gate of M1, and the drains of M5 and M6 are coupled to the gate of M2.

The leakage current problem of the conventional input/output circuit shown in FIG. 1 is discussed below in two circumstances:

(1) When the logic high voltage of the input/output circuit voltage $V_{I/O}$ is lower than the supply voltage $V_{CC}$ (for example, $V_{I/O}$=3V and $V_{CC}$=5V), and M1 and M2 are in an OFF state, the N-well voltage of M1 is $V_{CC}$. As a result of the input/output voltage being lower than the N-well voltage of M1, a forward diode leakage current is non-existent between the P+ region and the N-Well of M1.

(2) When the logic high voltage of the input/output circuit voltage $V_{I/O}$ is higher than the supply voltage $V_{CC}$ (for example, $V_{I/O}$=5V and $V_{CC}$=3V), and M1 and M2 are in an OFF state, the N-well voltage of M1 is $V_{CC}$. Therefore, a forward diode leakage current exists between the P+ region and N-well of M1, as shown in FIG. 2. The leakage current has a critical effect on the normal operation of M1.

In other words, when the logic high voltage of the input/output voltage $V_{I/O}$ is higher than the supply voltage $V_{CC}$, the leakage current problem is unavoidable. The leakage current then causes dissipation difficulties, which get more distinct when there are a bulky data bus and large difference between the data voltage and the supply voltage.

SUMMARY OF THE INVENTION

In the view of the above, an object of the invention is to provide a variable voltage tolerant input/output circuit that produces no leakage current.

Another object of the invention is to provide a variable voltage tolerant input/output circuit with high reliability.

To achieve the above objects, the variable voltage tolerant input/output circuit of the invention includes: a supply voltage; a first PMOS transistor, with one of its P+ regions coupled via an electrode to the supply voltage while the other P+ region coupled via an electrode to an output circuit; a second PMOS transistor, with one of its P+ regions coupled via an electrode to the supply voltage while the other P+ region coupled via an electrode to the gate of the first PMOS transistor, and its gate coupled to an input control circuit; a third PMOS transistor, with its source coupled to the supply voltage and its gate coupled to another input control circuit; a first NMOS transistor, with its drain coupled to the output circuit, its source coupled to the ground voltage, and its gate coupled to the drain of the third PMOS transistor; a second NMOS transistor, with its drain coupled to the gate of the first PMOS transistor, its source coupled to the ground voltage, and its gate coupled to the gate of the second PMOS transistor; a third NMOS transistor, with its drain coupled to the gate of the first NMOS transistor, its source coupled to the ground voltage, and its gate coupled to the gate of the third PMOS transistor.

The circuit further includes a clamping circuit which includes:

a fourth PMOS transistor, with its gate coupled to the N-well of the first PMOS transistor, one of its P+ regions coupled via an electrode to the supply voltage while the other P+ region coupled via an electrode to the N-well of the first PMOS transistor; a fifth PMOS transistor, with its gate coupled to the N-well of the first PMOS transistor, one of its P+ regions coupled via an electrode to the N-well of the PMOS transistor while the other P+ region coupled via an electrode to the output circuit. The P+ region of the second PMOS transistor originally coupled via an electrode to the supply voltage is replaced by the N-well coupled via an electrode to the first PMOS transistor.

By means of the variable voltage tolerant input/output circuit design provided by the invention, it is made sure that the data bus voltage is not distorted due to large difference between it and the integrated circuit voltage, and the problem of being unable to function and operate normally due to excessive power consumed by the integrated circuit is also overcome.

DESCRIPTION OF THE PREFERRED EMBODIMENTS

Figure 1:
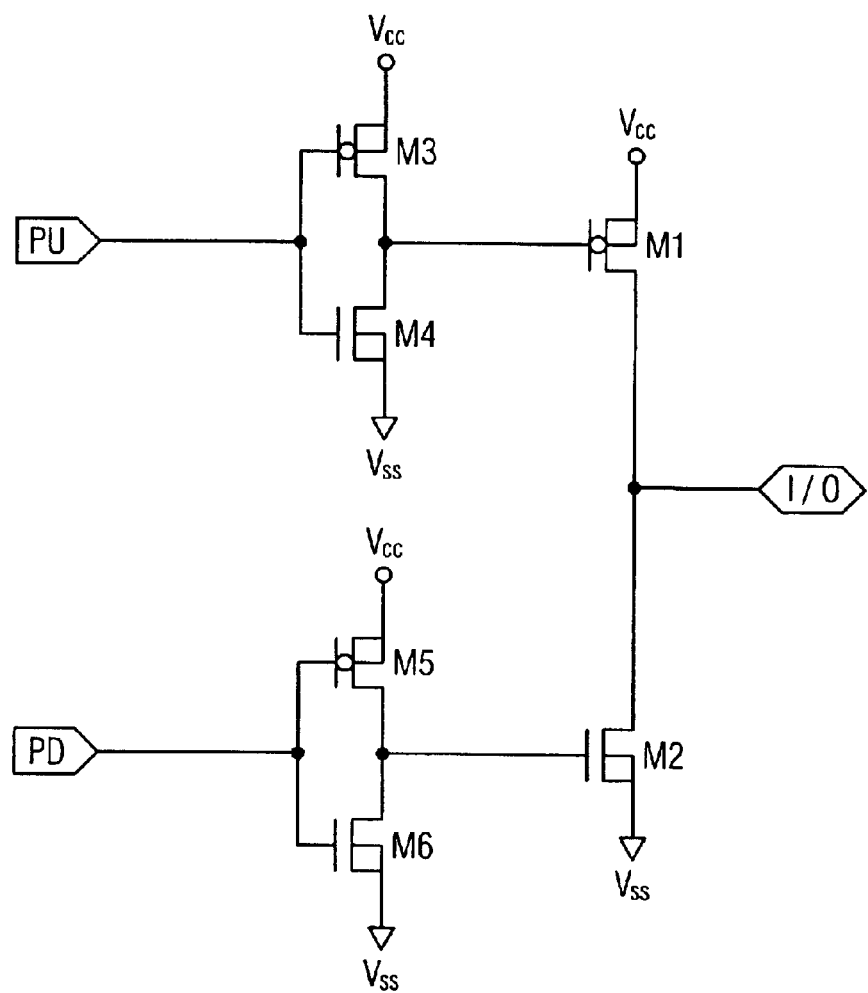
FIG. 1 is the circuit diagram of a conventional input/output circuit.
Figure 2:
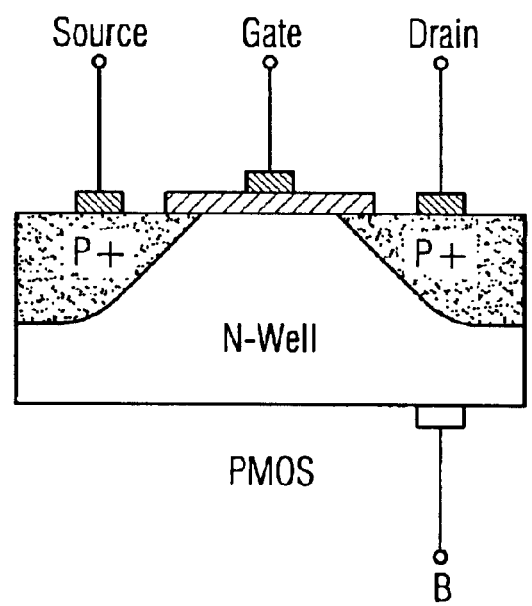
FIG. 2 is the structural diagram of a PMOS transistor.
Figure 3:
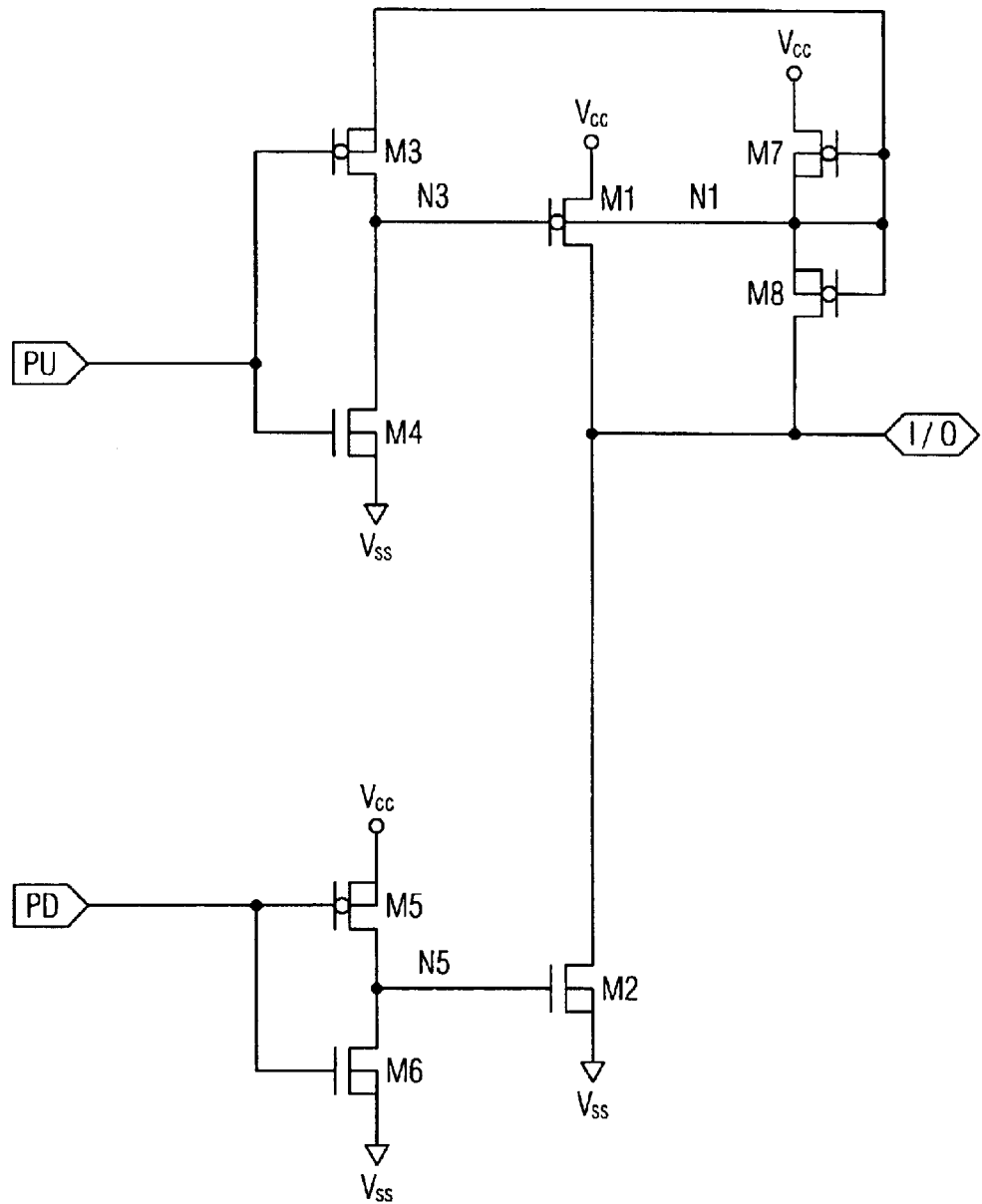
FIG. 3 is the circuit diagram showing a variable voltage tolerant input/output circuit in accordance with a first preferred embodiment of the invention.

Referring to FIG. 3, a variable voltage tolerant input/output circuit in accordance with a first preferred embodiment of the invention includes: a supply voltage $V_{CC}$, a ground voltage $V_{SS}$, a first PMOS transistor M1, a second PMOS transistor M3, a third PMOS transistor M5, a fourth PMOS transistor M7, a fifth PMOS transistor M8, a first NMOS transistor M2, a second NMOS transistor M4 and a third NMOS transistor M6.

M7 and M8 therein form a clamping circuit utilized to clamp the N-well potential of M1; when the supply voltage $V_{CC}$ is higher than or equal to the input/output voltage $V_{I/O}$, the N-well potential of M1 is clamped to the supply voltage $V_{CC}$; when the supply voltage $V_{CC}$ is lower than the input/output voltage $V_{I/O}$, the N-well potential of M1 is clamped to the input/output voltage $V_{I/O}$.

One P+ region of M1 is coupled via an electrode to the output circuit, while the other P+ region of M1 is coupled to the supply voltage $V_{CC}$. The drain of M2 is coupled to the output circuit, and the source of M2 is coupled to the ground voltage $V_{SS}$. One P+ region of M3 is coupled via an electrode to the N-well of M1, while the other P+ region is coupled via an electrode to the gate of M1, and the gate of M3 is coupled to the input control signal PU. The drain of M4 is coupled to the gate of M1, the source of M4 is coupled to the ground voltage $V_{SS}$, and the gate of M4 is coupled to the input control signal PU. The source of M5 is coupled to the supply voltage $V_{CC}$, the drain of M5 is coupled to the gate of M2, and the gate of M5 is coupled to the input control signal PD. The drain of M6 is coupled to the gate of M2, the source of M6 is coupled to the ground voltage $V_{SS}$, and the gate of M6 is coupled to the input control signal PD. One P+ region of M7 is coupled via an electrode to the supply voltage $V_{CC}$ while the other P+ region is coupled via an electrode to the N-well of M1, and the gate of M7 is coupled to the N-well of M1. One P+ region of M8 is coupled via an electrode to the output circuit, while the other P+ region is coupled via an electrode to the N-well of M1, and the gate of M8 is coupled to the N-well of M1.

The two circumstances below are provided to discuss whether or not a leakage current exists in the input/output circuit of the invention shown in FIG. 3:

(1) When the logic high voltage of the input/output voltage $V_{I/O}$ is lower than the supply voltage $V_{CC}$ (for example, $V_{I/O}$=3V and $V_{CC}$=5V), and M1 and M2 are in an OFF state, the voltage of the node N1 is $V_{CC}$ owing to the effect of the clamping circuits M7 and M8. In this case, the N-well voltage of M1 is clamped to $V_{CC}$, and the drain voltage of M1 is $V_{I/O}$=3V, and therefore a forward diode leakage current in non-existent between the N-well and the drain P+ of M1. In addition, the source voltage of M3 is also clamped to $V_{CC}$, and M3 is in an ON state, thereby the node N3 voltage is raised to $V_{CC}$. In other words, the gate voltage of M1 is $V_{CC}$, the source voltage is $V_{CC}$, and the drain voltage is $V_{I/O}$, consequently the channel cut-off leakage current of M1 can be disregarded.

(2) When the logic high voltage of the input/output circuit voltage $V_{I/O}$ is higher than the supply voltage $V_{CC}$ (for example, $V_{I/O}$=5V and $V_{CC}$=3V), and M1 and M2 are in an OFF state, owing to the effect of the clamping circuits M7 and M8, the voltage of the node N1 is $V_{I/O}$, the N-well voltage of M1 is clamped to $V_{I/O}$, and the drain voltage of M1 is also $V_{I/O}$. Because the N-well voltage of M1 is not lower than the source and drain voltages of M1, a forward diode leakage current is non-existent between the N-well and the drain P+ of M1. In addition, the source voltage of M3 is also clamped to $V_{CC}$, and M3 is in an ON state, thereby the node N3 voltage is raised to $V_{I/O}$. In other words, the gate voltage of M1 is $V_{I/O}$, the source voltage of M1 is $V_{CC}$, and consequently the channel cut-off leakage current of M1 can be disregarded.

Based on the above analysis, the input/output circuit shown in FIG. 3, regardless of the logic high voltage $V_{I/O}$ being higher or lower than the supply voltage $V_{CC}$, the problem of leakage current is not incurred.

Apart from the leakage current problem being effectively solved by the clamping circuits of the invention, the circuit elements can also be prevented from damage by means of protection circuits, thereby providing an input/output circuit with high reliability as illustrated below.

Figure 4:
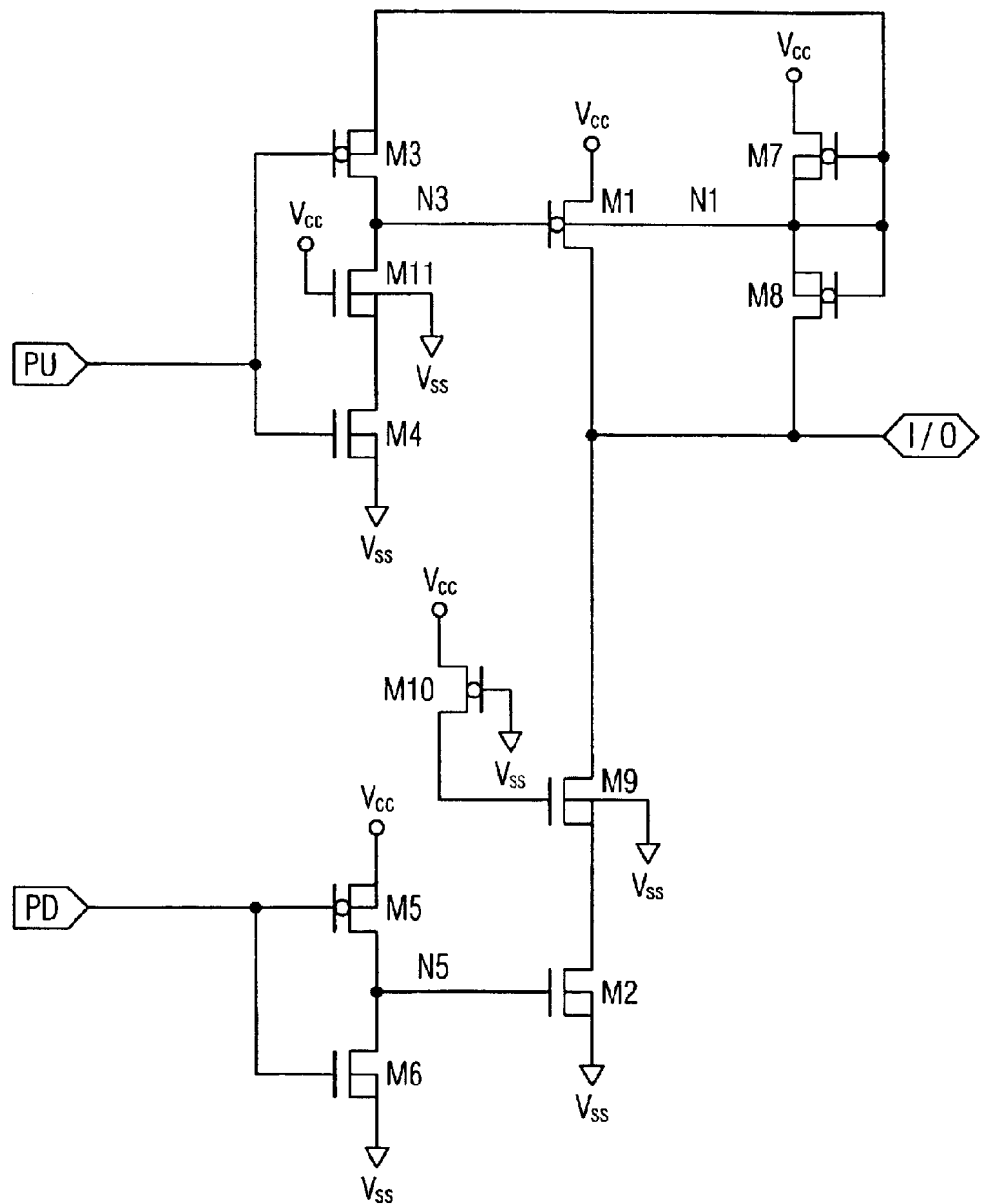
FIG. 4 is the circuit diagram showing a variable voltage tolerant input/output circuit in accordance with a second preferred embodiment of the invention.

Referring to FIG. 4, in a second preferred embodiment of the invention, two protection circuits are added to the variable voltage tolerant input/output circuit of the first preferred embodiment. The first protection circuit is composed of an NMOS transistor M9 and a PMOS transistor M11, used to limit the drain potential of M2 so that a voltage avalanche breakdown and a hot carrier reliability problem of M2 are not caused due the potential difference between the source and drain of M2. The second protection circuit is composed of an NMOS transistor M11, used to limit the drain potential of M4 so that a voltage avalanche breakdown and a hot carrier problem of M4 are not caused due to the potential difference between the source and drain of M4.

The specific description and examples of the aforesaid preferred embodiments are only illustrative and are not to be construed as limiting the invention. Various modifications can be made without departing from the true spirit of the invention as defined by the appended claims.

What is claimed is:

1. A variable voltage tolerant input/output circuit comprising:
    a supply voltage;
    a ground voltage;
    a first PMOS transistor, with one of its P+ regions coupled via an electrode to the supply voltage, while the other P+ region coupled via an electrode to an output circuit;
    a second PMOS transistor, with one of its P+ regions coupled via an electrode to the supply voltage, while the other P+ region coupled to the gate of the first PMOS transistor, and its gate coupled to an input control circuit;
    a third PMOS transistor, with its source coupled to the supply voltage, and its gate coupled to another input control circuit;
    a first NMOS transistor, with its drain coupled to the output circuit, its source coupled to the ground voltage, and its gate coupled to the drain of the third PMOS transistor;
 a second NMOS transistor, with its drain coupled to the gate of the first PMOS transistor, its source coupled to the ground voltage, and its gate coupled to the gate of the second PMOS transistor;
    a third NMOS transistor, with its drain coupled to the gate of the first NMOS transistor, its source coupled to the ground voltage, and its gate coupled to the gate of the third PMOS transistor; and
    characterized in that the variable voltage tolerant input/output circuit further comprises a clamping circuit including,
    a fourth PMOS transistor, with its gate coupled to the N-well of the first PMOS transistor, and one of its P+ regions coupled via an electrode to the supply voltage, while the other P+ region coupled via an electrode to the N-well of the first PMOS transistor; and a fifth PMOS transistor, with its gate coupled to the N-well of the first PMOS transistor, and one of its P+ regions coupled via an electrode to the N-well of the first PMOS transistor, while the other P+ region coupled via an electrode to the output circuit, wherein the P+ region of the second PMOS transistor originally coupled via an electrode to the supply voltage is replaced by the N-well coupled via an electrode to the first PMOS transistor.

2. The variable voltage tolerant input/output circuit as described in claim 1 further comprising:

a first protection circuit, used to limit the potential of the first NMOS transistor so that a voltage avalanche breakdown of the first NMOS transistor is not caused due to the potential difference between the source and drain of the first NMOS transistor, while reducing a channel cut-off leakage current of the first NMOS transistor at the same time; and a second protection circuit, used to limit the potential of the second NMOS transistor so that a voltage avalanche breakdown of the second NMOS transistor is not caused due to the potential difference between the source and drain of the second NMOS transistor, while reducing a channel cut-off leakage current of the second NMOS transistor at the same time.

3. The variable voltage tolerant input/output circuit as described in claim 2, wherein the first protection circuit comprises:

a fourth NMOS transistor, with its drain coupled to the output circuit and its source coupled to the drain of the first NMOS transistor;

a sixth PMOS transistor, with its source coupled to the supply voltage, its gate coupled to the ground voltage, and its drain coupled to the gate of the fourth NMOS transistor, and the second protection circuit comprises, a fifth NMOS transistor, with its drain coupled to the gate of the first PMOS transistor, its gate coupled to the supply voltage, and its source coupled to the drain of the second NMOS transistor.

* * * * *